(12) United States Patent
Hao et al.

(10) Patent No.: US 6,433,484 B1
(45) Date of Patent: Aug. 13, 2002

(54) WAFER AREA PRESSURE CONTROL

(75) Inventors: Fangli Hao, Cupertino; Eric Lenz, Pleasanton; Bruno Morel, Santa Clara, all of CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/637,736

(22) Filed: Aug. 11, 2000

(51) Int. Cl.[7] .................................................. H01G 7/24
(52) U.S. Cl. .............. 315/111.21; 315/108; 315/111.71; 118/723 R; 156/345; 438/710
(58) Field of Search ............................ 315/108, 111.21, 315/111.71, 111.91; 118/723 R; 156/345; 438/710

(56) References Cited

U.S. PATENT DOCUMENTS

| | | | |
|---|---|---|---|
| 5,534,751 A | | 7/1996 | Lenz et al. .............. 315/111.71 |
| 5,968,275 A | * | 10/1999 | Lee et al. ................ 118/723 R |
| 5,998,932 A | * | 12/1999 | Lenz ...................... 315/111.21 |
| 6,008,130 A | * | 12/1999 | Henderson et al. .......... 438/710 |
| 6,019,060 A | * | 2/2000 | Lenz ....................... 118/723 R |
| 6,068,784 A | | 5/2000 | Collins et al. ................ 216/68 |
| 6,178,919 B1 | * | 1/2001 | Li et al. .................... 118/723 E |

OTHER PUBLICATIONS

U.S. patent application Ser. No. 09/474,843, File Date: Dec. 30, 1999.

* cited by examiner

*Primary Examiner*—Don Wong
*Assistant Examiner*—Tuyet T. Vo
(74) *Attorney, Agent, or Firm*—Beyer Weaver & Thomas, LLP

(57) ABSTRACT

A plasma processing chamber is provided which provides improved wafer area pressure control. The plasma processing chamber is a vacuum chamber with a device connected for generating and sustaining a plasma. Part of this device would be an etchant gas source and an exhaust port. A confinement ring defines an area above a wafer. The wafer area pressure is dependent on the pressure drop across the confinement ring. The confinement ring is part of a confinement device that provides wafer area pressure control greater than 40%. Such a confinement device may be a fixed vertical restriction ring in addition to the confinement ring, where the confinement ring is adjustable. In the alternative, three adjustable confinement rings may be used to provide the desired wafer area pressure control.

27 Claims, 10 Drawing Sheets

WAFER AREA PRESSURE CONTROL

BACKGROUND OF THE INVENTION

The present invention relates to the fabrication of semiconductor-based devices. More particularly, the present invention relates to improved techniques for controlling the pressure in plasma processing chambers.

In the fabrication of semiconductor-based devices (e.g., integrated circuits, or flat panel displays) layers of material may alternately be deposited onto and etched from a substrate surface (e.g., the semiconductor wafer or the glass panel). As is well known in the art, the etching of the deposited layer(s) may be accomplished by a variety of techniques, including plasma-enhanced etching. In plasma-enhanced etching, the actual etching of the substrate takes place inside a plasma processing chamber. During etching, a plasma is formed from a suitable etchant source gas to etch areas of the substrate that are unprotected by the mask, leaving behind the desired pattern.

Among different types of plasma etching systems, those utilizing confinement rings have proven to be highly suitable for efficient production and/or for forming the ever shrinking features on the substrate. An example of such a system may be found in commonly assigned U.S. Pat. No. 5,534,751, which is incorporated by reference herein. Although the use of confinement rings results in a significant improvement in the performance of plasma processing systems, current implementations can be improved. In particular, it is realized that improvements can be made in the way in which pressure is controlled in a plasma processing system.

To facilitate discussion, FIG. 1 depicts an exemplary plasma processing chamber 100, including confinement rings 102 as they are currently implemented. Within plasma processing chamber 100, there is shown a chuck 104, representing the workpiece holder on which a substrate 106 is positioned during etching. Chuck 104 may be implemented by any suitable chucking technique, e.g., electrostatic, mechanical clamping, vacuum, or the like. During etching, RF power supply 110 may source RF power having a frequency of, for example, about 2 MHz to about 27 MHz, to chuck 104. Above substrate 106, there is disposed a reactor top 112, which supports an upper electrode 124 with an RF power supply 126. An etchant gas source 120 supplies a gas to a region within the confinement rings 102. The upper electrode 124 may be used to excite the etchant gas to a plasma and to sustain the plasma. The gas and plasma are vented to a region outside of the confinement rings 102 to an exhaust port 122.

Commonly assigned, U.S. Pat. No. 6,019,060 entitled "Cam-Based Arrangement For Positioning Confinement Rings In A Plasma Processing Chamber" by Eric H. Lenz, issued Feb. 1, 2000, incorporated by reference taught that the pressure drop across the confinement rings is approximately proportional to the expression $1/(x^2+y^2+z^2)$, where x, y, and z are the distances between confinement rings, as shown in FIG. 1. Lenz provided a single moveable confinement ring and a stationary confinement ring. By adjusting the distances between the confinement rings 102 by moving the single movable confinement ring, as taught by Lenz, a pressure control range of 17 to 30% may be obtained. With a pressure control above 30% the plasma may become unconfined due to the large gap between the rings. By controlling the pressure drop across the confinement rings the pressure within the confinement rings, the wafer area, may be controlled.

It is desirable to provide an increased control of pressure across the confinement rings.

SUMMARY OF THE INVENTION

To achieve the foregoing and other objects and in accordance with the purpose of the present invention, a plasma processing device. A vacuum chamber with an exhaust port in fluid connection with the vacuum chamber and a gas source in fluid connection with the vacuum chamber is provided. Within the vacuum chamber a confinement device for providing wafer area pressure control greater than 40% is placed.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
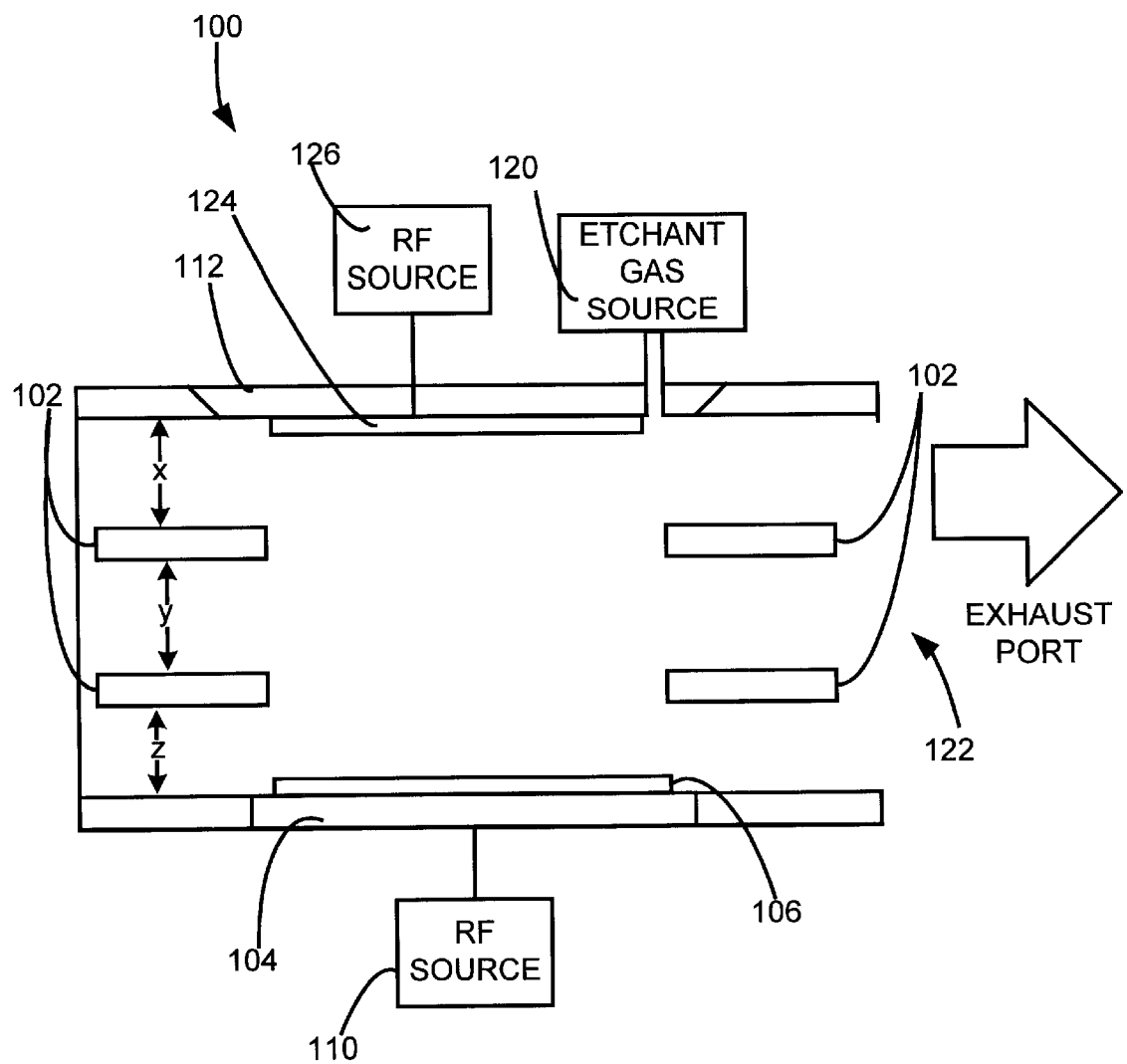
FIG. 1 is a schematic view of a prior art plasma processing chamber.
Figure 2:
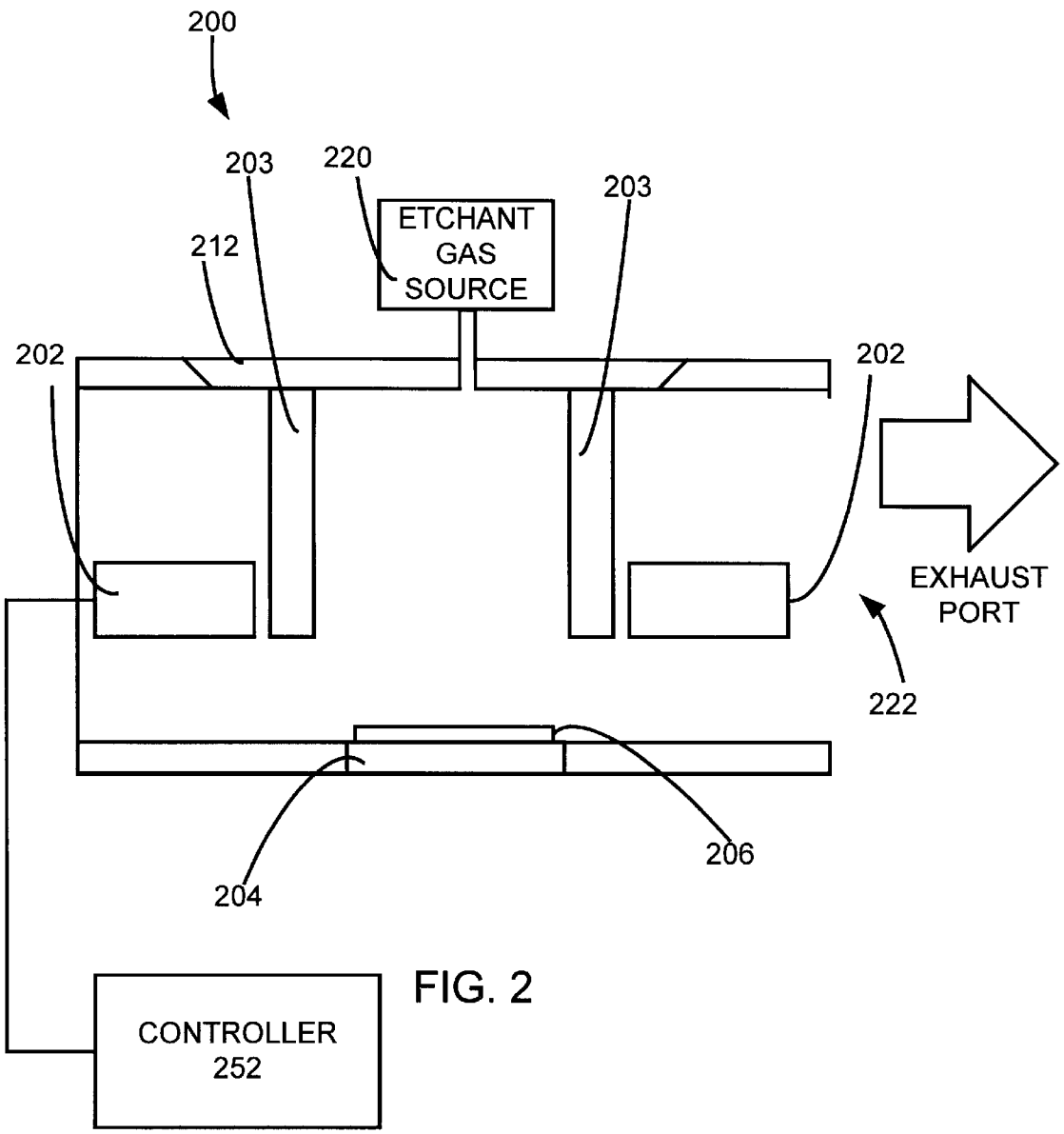
FIG. 2 is a schematic view of plasma processing chamber according to one embodiment of the invention.

To facilitate discussion, FIG. 2 is a schematic view of plasma processing chamber 200, including a adjustable confinement ring 202 and a fixed inner vertical restriction ring 203 according to one embodiment of the invention. The inner vertical restriction ring has a fixed end, connected to the top 212 of the plasma processing chamber 200 and a free end adjacent to the confinement ring 202. In the specification and claims an adjustable confinement ring is defined as a confinement ring that may be adjusted or moved in an axial direction (up or down) during a plasma processing process to adjustably control the wafer area pressure. A controller 252 connected to the confinement ring 202 allows the adjustment of the confinement ring 202 during the plasma processing process. Within plasma processing chamber 200, there is shown a chuck 204, representing the workpiece holder on which a substrate 206 is positioned during etching. Chuck 204 may be implemented by any suitable chucking technique, e.g., electrostatic, mechanical clamping, vacuum, or the like. An etchant gas source 220 and an exhaust port 222 are connected to the processing chamber 200. Other plasma generation equipment, such as described above and illustrated in FIG. 1, is also provided to the plasma processing chamber, but is not shown for clarity. Such plasma generation equipment may be capacitive as illustrated in FIG. 1 or inductive, or may be another type of plasma generation device.

During etching, the etchant gas source 220 supplies a gas to a region within the confinement ring 202. The gas is vented to a region outside of the confinement ring 202 to an exhaust port 222. The pressure in the area above the substrate 206 (wafer) is determined by the rate of introduction of the etchant gas from the etchant gas source 220 into the area above the substrate 206 within the confinement ring 202, the rate of flow of gas through the exhaust port 222 outside of the confinement ring 202, and the pressure drop across the confinement ring 202. The pressure drop across the confinement ring 202 is dependent on the flow of gas past the confinement ring 202.

Figure 3:
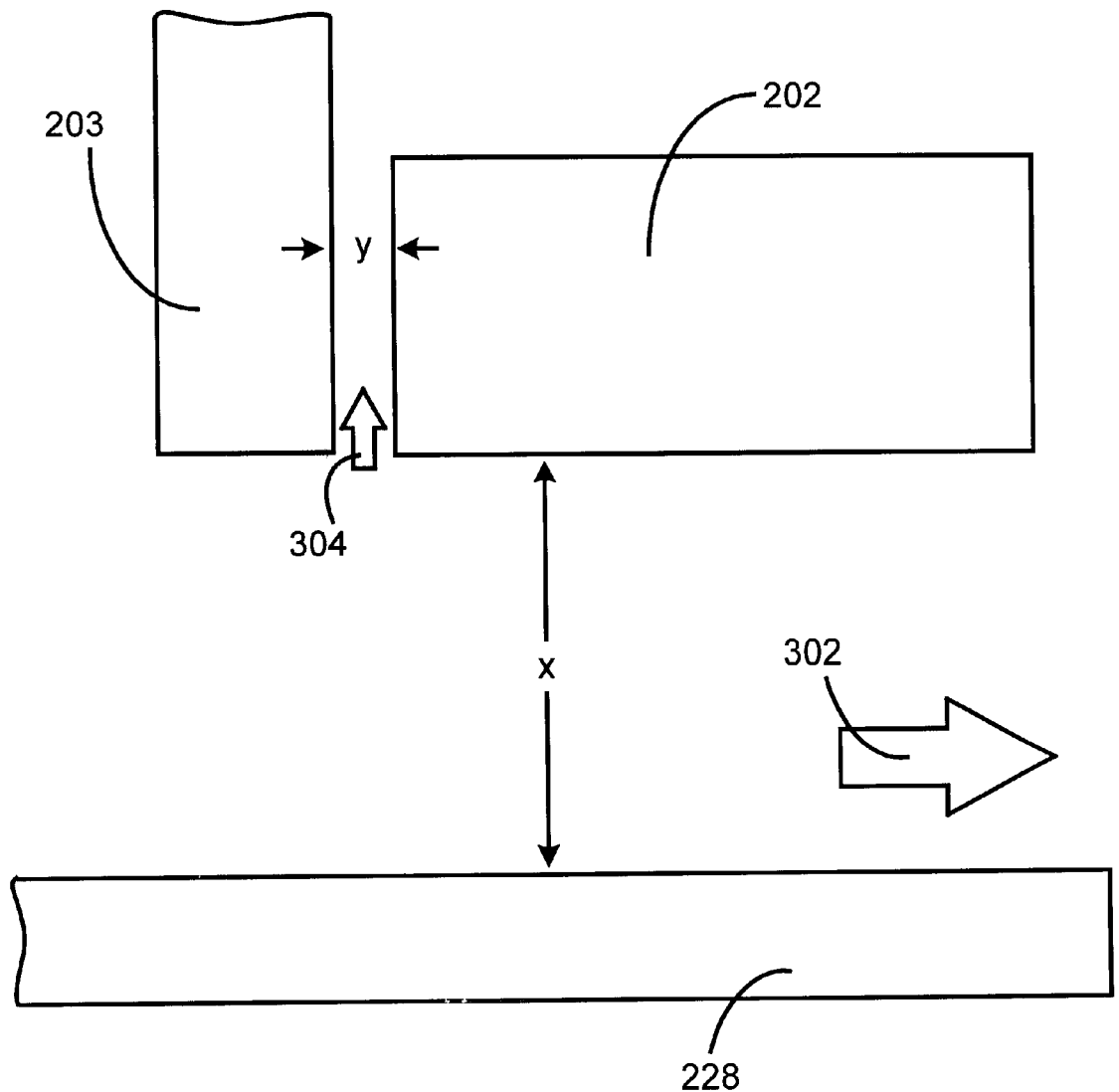
FIG. 3 is an enlarged view of a cross-section of the confinement ring and vertical restriction ring of FIG. 2

FIG. 3 is an enlarged view of a cross-section of the confinement ring 202 and vertical restriction ring 203 of FIG. 2. The flow of gas past the confinement ring 202 has a first component 302, which flows between the confinement ring 202 and the bottom 228 of the process chamber, and a second component 304, which flows between the confinement ring 202 and the vertical restriction ring 203. The distance between the confinement ring 202 and the bottom 228 of the process chamber is indicated as "x". The distance between the confinement ring 202 and the vertical restriction ring 203 is indicated by "y", which in this embodiment is substantially constant. The pressure drop across the confinement ring is approximately proportional to the expression $1/(x^2+y^2)$. When the adjustable confinement ring 202 is at its highest position, the distance between the confinement ring 202 and the bottom 228 "x" is maximum and $1/(x^2+y^2)$ is therefore at its minimum, so that the pressure drop across the confinement ring is at its minimum. In such a configuration the first component 302 may be 95% of the gas flow and the second component 304 may be 5% of the gas flow.

Figure 4:
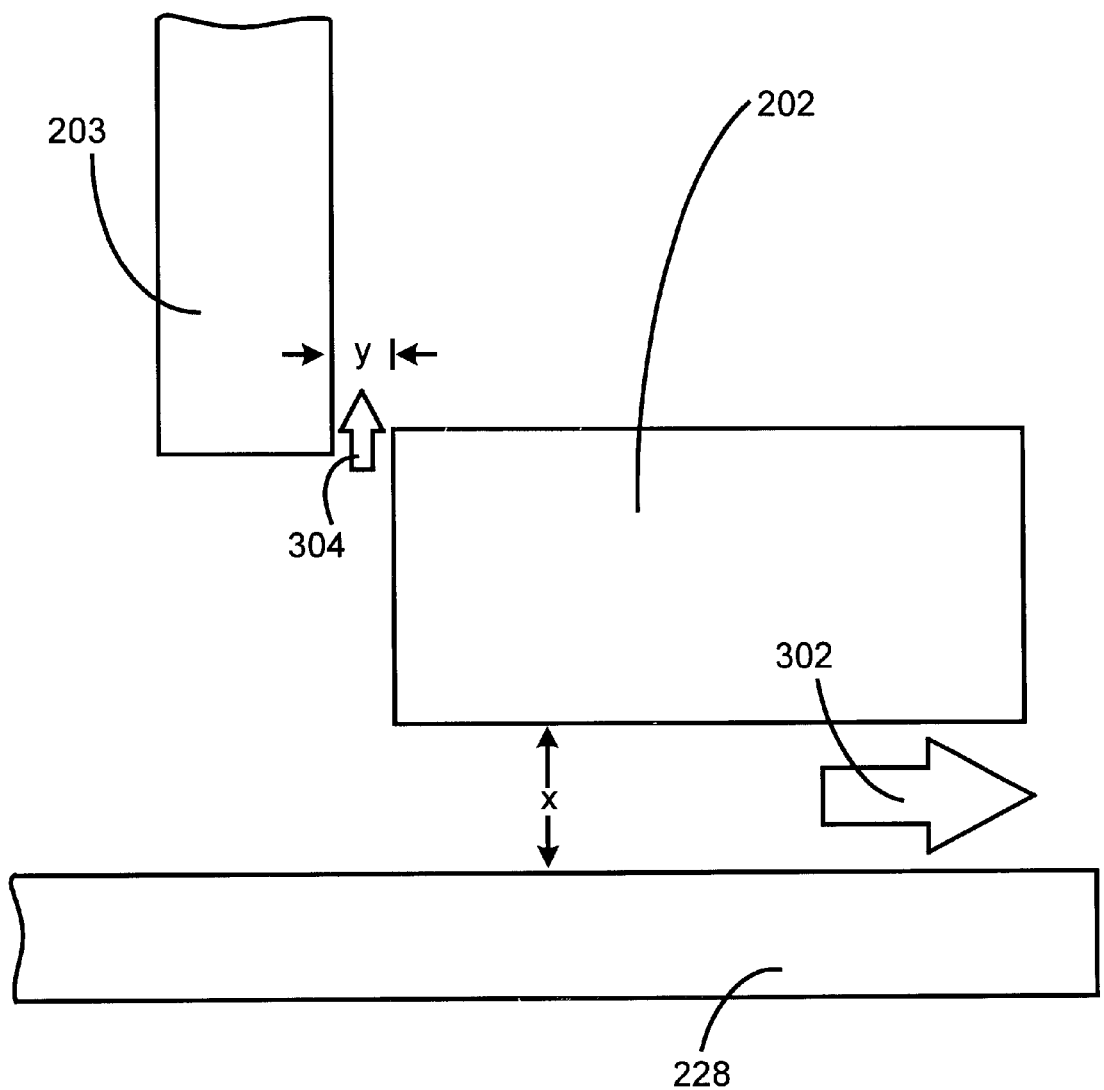
FIG. 4 is an enlarged view of a cross-section of the adjustable confinement ring and vertical restriction ring when the adjustable confinement ring is lowered to its lowest position.

FIG. 4 is an enlarged view of a cross-section of the adjustable confinement ring 202 and vertical restriction ring 203 when the adjustable confinement ring 202 is lowered to its lowest position. Again, the pressure drop across the confinement ring is approximately proportional to the expression $1/(x^2+y^2)$. When the adjustable confinement ring 202 is at its lowest position, the distance between the confinement ring 202 and the bottom 228 "x" is minimum and $1/(x^2+y^2)$ is therefore at its maximum, so that the pressure drop across the confinement ring is at its maximum. In such a configuration the first component 302 may be 90% of the gas flow and the second component 304 may be 10% of the gas flow. The change in the pressure across the confinement ring as the adjustable confinement ring 202 goes from the highest position, as shown in FIG. 2 and FIG. 3, to the lowest position, as shown in FIG. 4, is about 90%, thus providing 90% wafer area pressure control.

Figure 5:
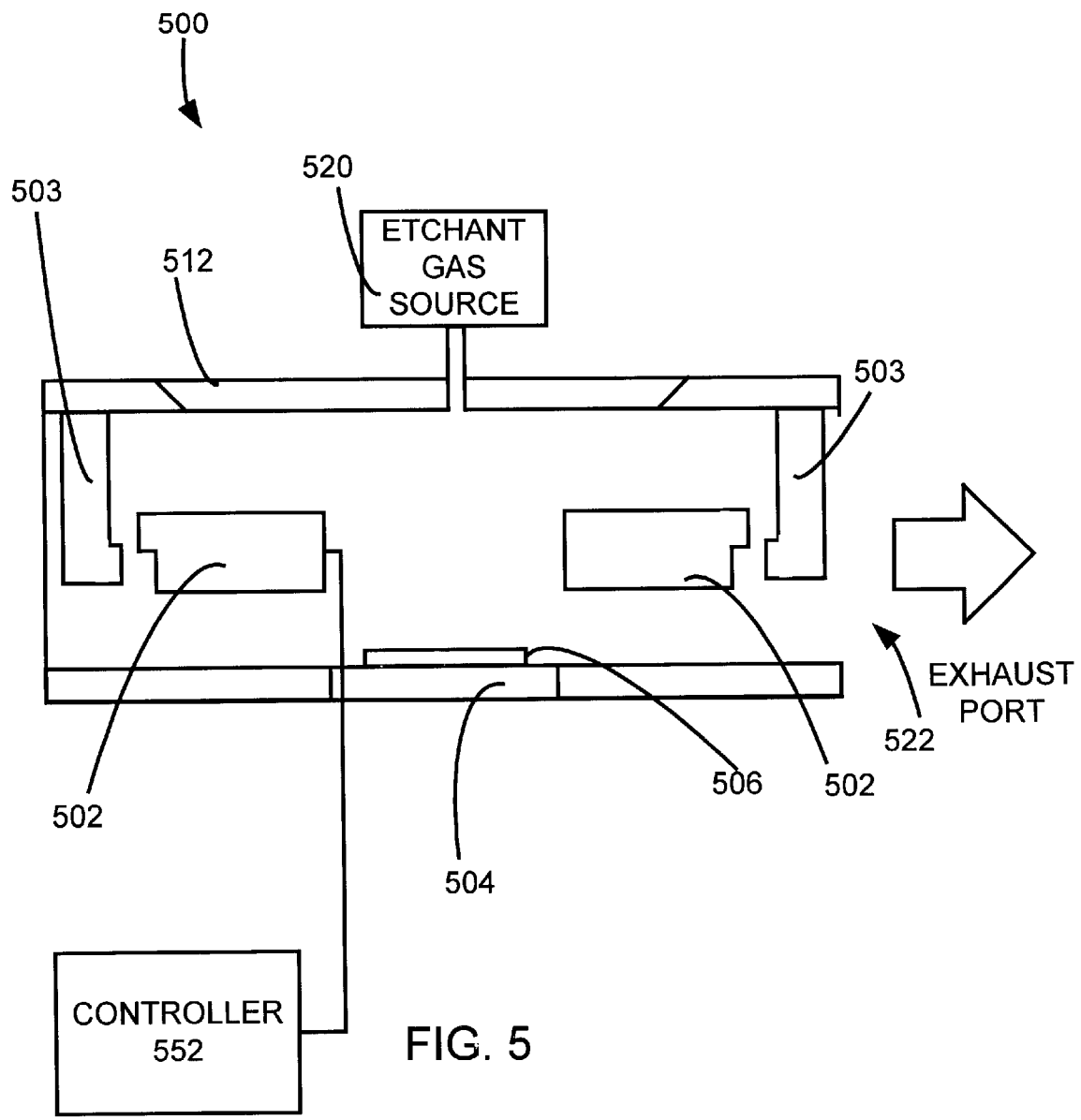
FIG. 5 is a schematic view of plasma processing chamber according to a second embodiment of the invention.

FIG. 5 is a schematic view of plasma processing chamber 500, including a adjustable confinement ring 502 and a fixed outer vertical restriction ring 503 according to a second embodiment of the invention. The fixed outer vertical restriction ring 503 has a fixed end connected to the top 512 of the plasma processing chamber 500 and a free end adjacent to the confinement ring 502. A controller 552 connected to the confinement ring 502 allows the adjustment of the confinement ring 502 during the plasma processing process. Within plasma processing chamber 500, there is shown a chuck 504, representing the workpiece holder on which a substrate 506 is positioned during etching. Chuck 504 may be implemented by any suitable chucking technique, e.g., electrostatic, mechanical clamping, vacuum, or the like. An etchant gas source 520 and an exhaust port 522 are connected to the processing chamber 500. Other plasma generation equipment, such as described above and illustrated in FIG. 1, is also provided to the plasma processing chamber, but is not shown for clarity. Such plasma generation equipment may be capacitive as illustrated in FIG. 1 or inductive, or may be another type of plasma generation device.

During etching, the etchant gas source 520 supplies a gas to a region within the confinement ring 502. The gas is vented to a region outside of the confinement ring 502 to the exhaust port 522. The pressure in the area above the substrate 506 (wafer) is determined by the rate of introduction of the etchant gas from the etchant gas source 520 into the area above the substrate 506 within the confinement ring 502, the rate of flow of gas through the exhaust port 522 outside of the confinement ring 502, and the pressure drop across the confinement ring 502. The pressure drop across the confinement ring 502 is dependent on the flow of gas past the confinement ring 502.

Figure 6:
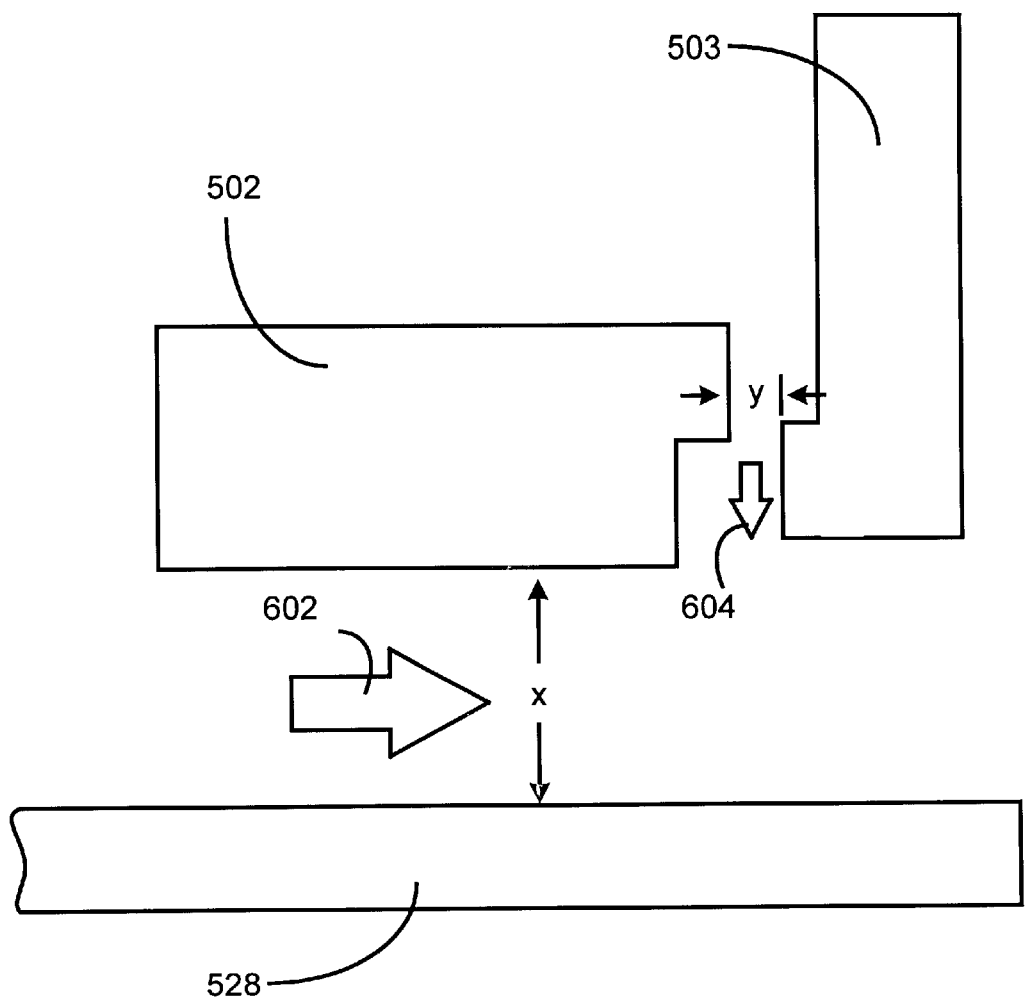
FIG. 6 is an enlarged view of a cross-section of the confinement ring and outer vertical restriction ring of FIG. 5.

FIG. 6 is an enlarged view of a cross-section of the confinement ring 502 and outer vertical restriction ring 503 of FIG. 5. The flow of gas past the confinement ring 502 has a first component 602, which flows between the confinement ring 502 and the bottom 528 of the process chamber, and a second component 604, which flows between the confinement ring 502 and the outer vertical restriction ring 503. The distance between the confinement ring 502 and the bottom 528 of the process charmber is indicated as "x". The distance between the confinement ring 502 and the outer vertical restriction ring 503 is indicated by "y", which in this embodiment is substantially constant. The pressure drop across the confinement ring is approximately proportional to the expression $1/(x^2+y^2)$. When the adjustable confinement ring 502 is at its highest position, the distance between the confinement ring 502 and the bottom 528 "x" is maximum and $1/(x^2+y^2)$ is therefore at its minimum, so that the pressure drop across the confinement ring is at its minimum. In such a configuration the first component 602 may be 95% of the gas flow and the second component 604 may be 5% of the gas flow.

Figure 7:
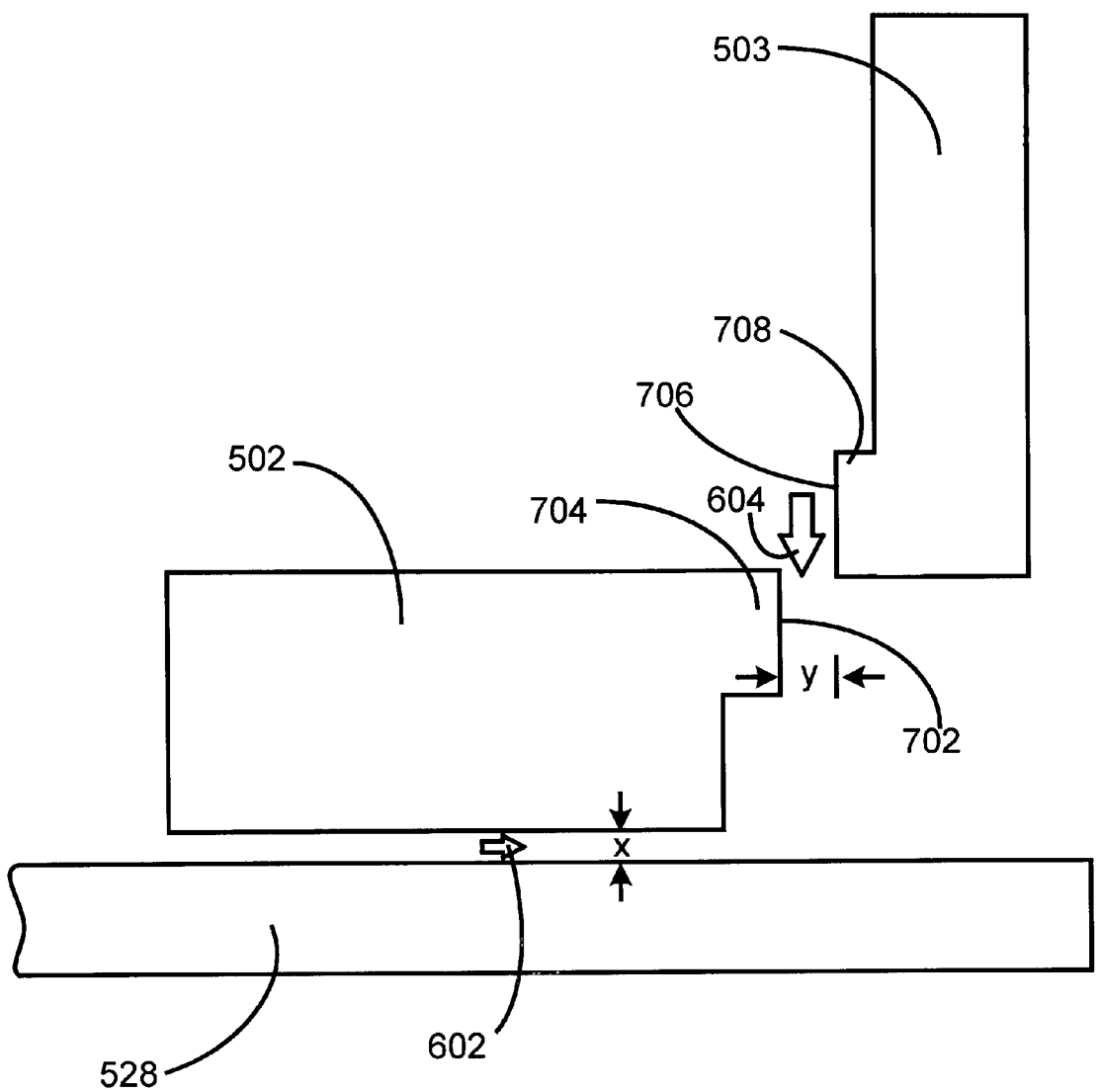
FIG. 7 is an enlarged view of a cross-section of the adjustable confinement ring and outer vertical restriction ring when the adjustable confinement ring is lowered to its lowest position.

FIG. 7 is an enlarged view of a cross-section of the adjustable confinement ring 502 and outer vertical restriction ring 503 when the adjustable confinement ring 502 is lowered to its lowest position. Again, the pressure drop across the confinement ring is approximately proportional to the expression $1/(x^2+y^2)$. When the adjustable confinement ring 502 is at its lowest position, the distance between the confinement ring 502 and the bottom 528 "x" is minimum and $1/(x^2+y^2)$ is therefore at its maximum, so that the pressure drop across the confinement ring is at its maximum.

In such a configuration the first component 602 may be 90% of the gas flow and the second component 604 may be 10% of the gas flow. The change in the pressure drop across the confinement ring as the adjustable confinement ring 502 goes from the highest position, as shown in FIG. 5 and FIG. 6, to the lowest position, as shown in FIG. 7, is about 100%, thus providing 100% wafer area pressure control.

In this embodiment, the confinement ring 502 has a leading edge 702 on a lip 704 that extends around the outer surface of the confinement ring 502. Similarly the outer vertical restriction ring 503 has a leading edge 706 on a lip 708 that extends around the inner surface of the outer vertical restriction ring 503. The distance between the leading edges 702, 706 determine the distance "y" between the confinement ring 502 and the vertical restriction ring 503. Such leading edges 702, 706 may be used to provide a more uniform and precise distance between the confinement ring 502 and the vertical restriction ring 503. Such lips and leading edges may be used in the previous embodiment.

Figure 8:
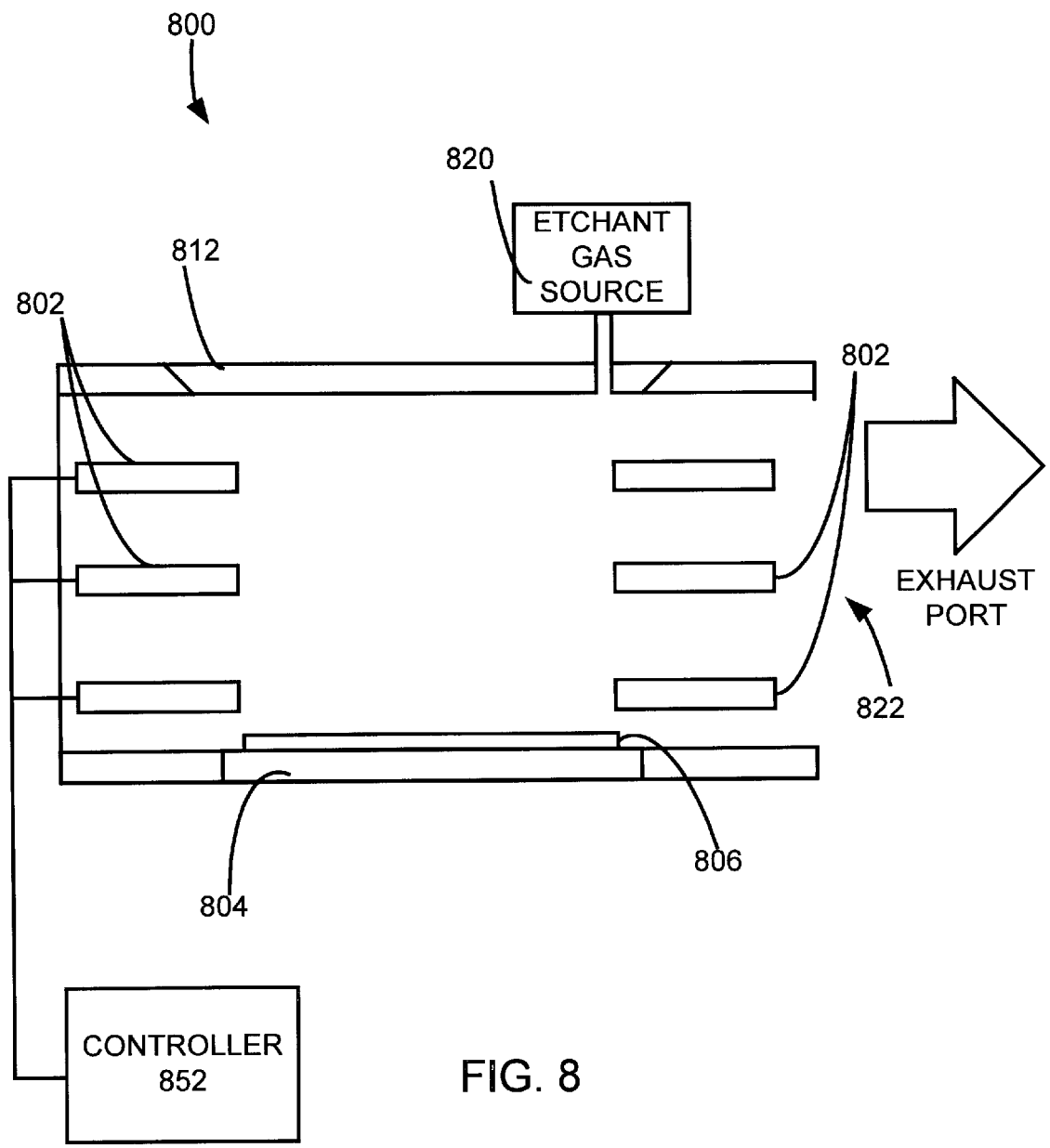
FIG. 8 is a schematic view of plasma processing chamber according to a third embodiment of the invention.

FIG. 8 is a schematic view of plasma processing chamber 800, including three adjustable confinement rings 802, according to a third embodiment of the invention. A controller 852 connected to each of the three adjustable confinement rings 802 allows the adjustment of the three adjustable confinement rings 802 during the plasma processing process. The controller 852 may comprise three smaller controllers where each smaller controller controls a single confinement ring or a single large controller that controls all three confinement rings. Within plasma processing chamber 800, there is shown a chuck 804, representing the workpiece holder on which a substrate 806 is positioned during etching. Chuck 804 may be implemented by any suitable chucking technique, e.g., electrostatic, mechanical clamping, vacuum, or the like. An etchant gas source 820 and an exhaust port 822 are connected to the processing chamber 800. Other plasma generation equipment, such as described above and illustrated in FIG. 1, is also provided to the plasma processing chamber, but is not shown for clarity. Such plasma generation equipment may be capacitive as illustrated in FIG. 1 or inductive, or may be another type of plasma generation device.

During etching, the etchant gas source 820 supplies a gas to a region within the confinement rings 802 near the top 812 of the processing chamber 800. The gas is vented to a region outside of the confinement rings 802 to the exhaust port 822. The pressure in the area above the substrate 806 (wafer) is determined by the rate of introduction of the etchant gas from the etchant gas source 820 into the area above the substrate 806 within the confinement rings 802, the rate of flow of gas through the exhaust port 822 outside of the confinement ring 802, and the pressure drop across the confinement rings 802. The pressure drop across the confinement rings 802 is dependent on the flow of gas past the confinement rings 802.

Figure 9:
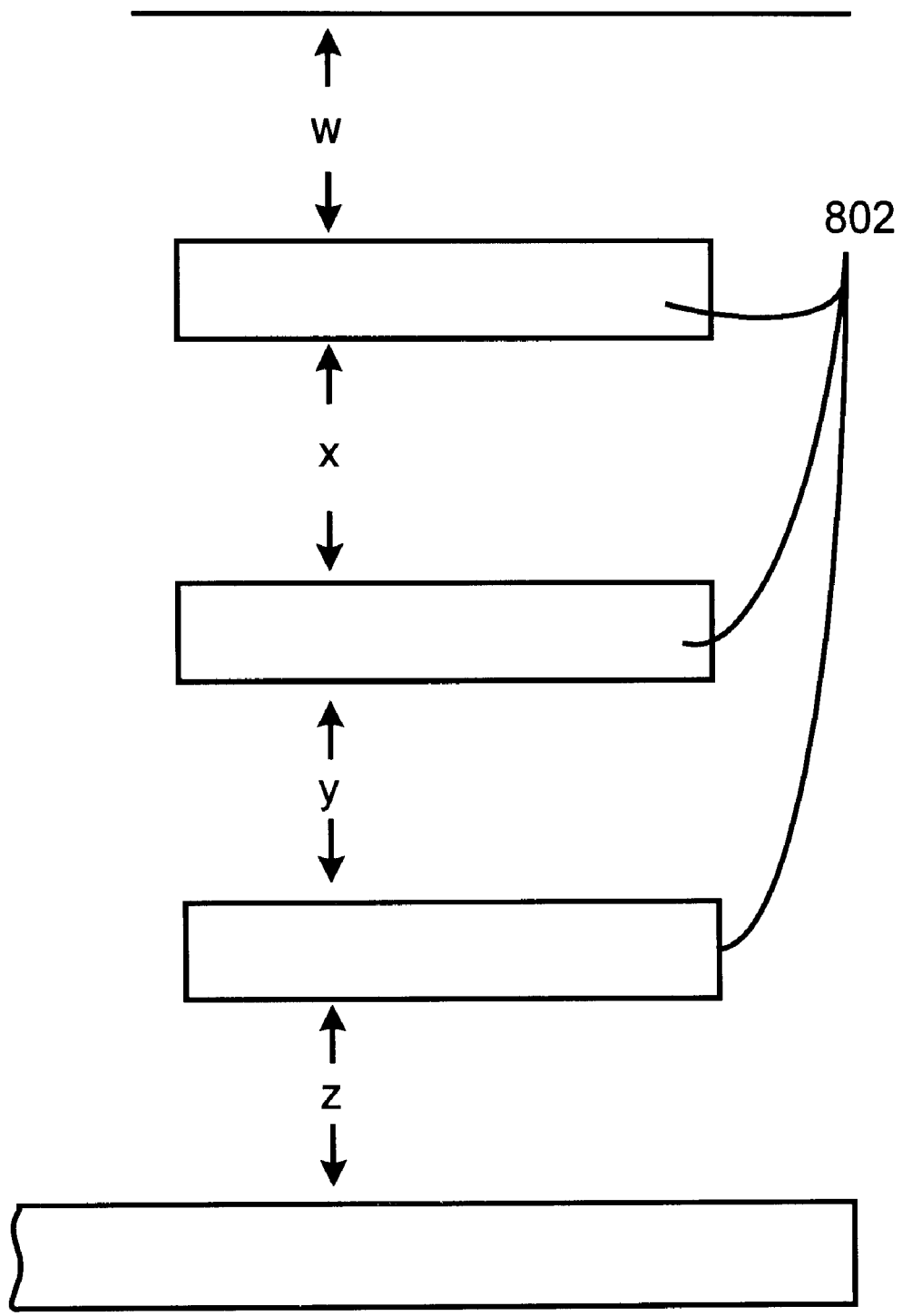
FIG. 9 is an enlarged view of a cross-section of the confinement rings of FIG. 8.

FIG. 9 is an enlarged view of a cross-section of the confinement rings 802 of FIG. 8.

Figure 10:
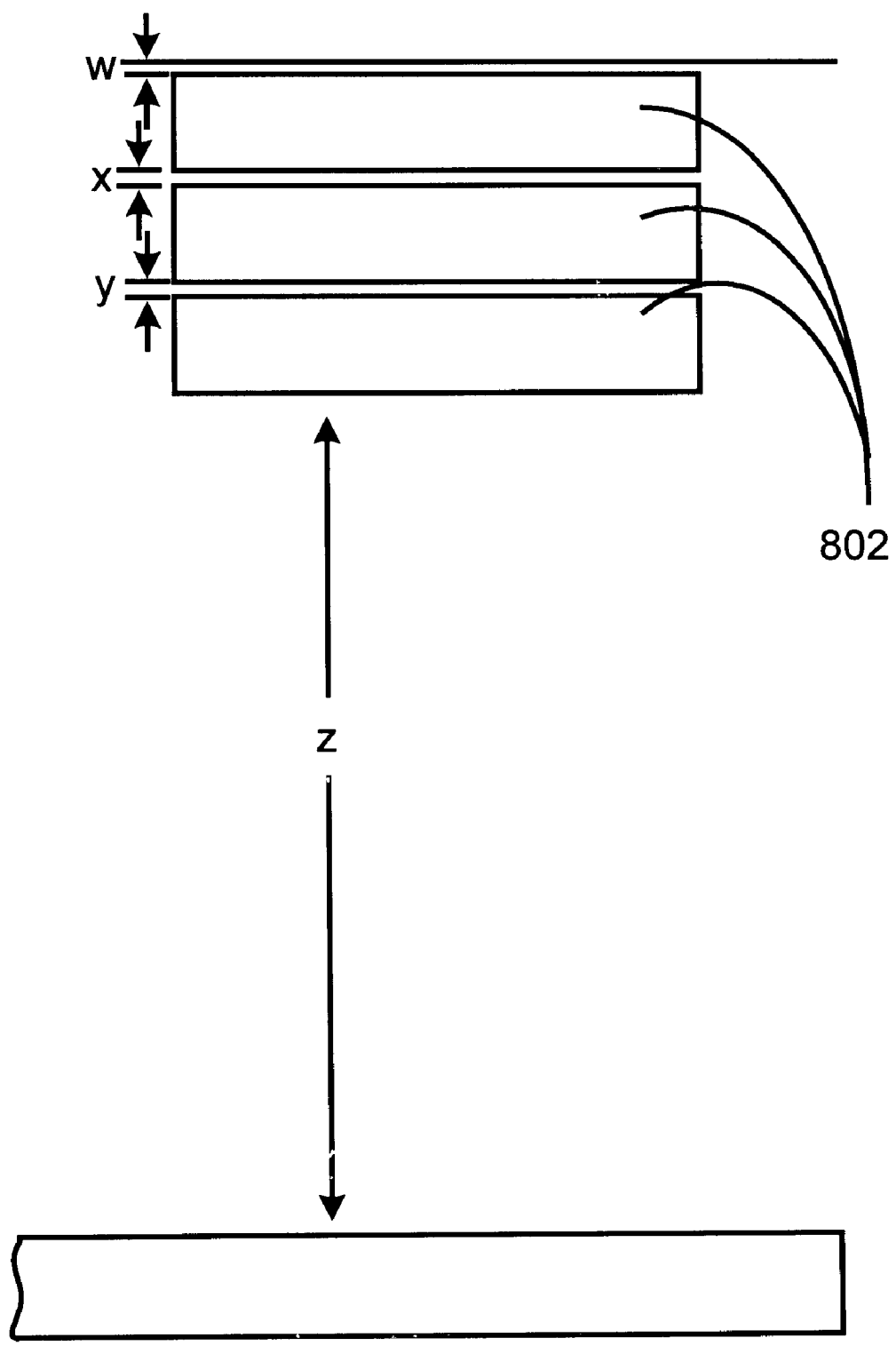
FIG. 10 shows an example of the confinement ring arrangement where a distance is maximized.

The pressure drop across the confinement rings is approximately proportional to the expression $1/(w^2+x^2+y^2+z^2)$, where w, x, y, and z are the distances between confinement rings as shown in FIG. 9. In this example $w \approx x \approx y \approx z$. This causes $1/(w^2+x^2+y^2+z^2)$ to be a maximum, which maximizes the pressure drop. Since all three confinement rings 802 are independently adjustable, the confinement rings 802 may be moved so that one of the distances x, y, z, or w may be maximized with the remaining distances minimized. FIG. 10 shows an example of the confinement ring arrangement where the distance z is maximized and y is minimized. As a result, the pressure drop across the confinement rings 802, which is approximately proportional to $1/(w^2+x^2+y^2+z^2)$, is minimized. It has been calculated that the differences between these two extremes in pressure drop provide a 40% wafer area pressure control.

In other embodiments with multiple confinement rings, more confinement rings may be used, where at least two of the confinement rings are adjustable. Preferably, at least three of the confinement rings are adjustable. In other embodiments with an inner or outer vertical restriction ring, more confinement rings may be used, where at least one of the confinement rings is adjustable.

All embodiments may provide confinement at higher wafer area pressure control than in the prior art.

The advantage of the embodiment with the inner vertical restriction ring is that the plasma may be confined to a smaller area and be in contact with a smaller surface area. The smaller surface area of contact means a smaller surface area needs to be cleaned A disadvantage of the inner vertical restriction ring is that deposits on the inner vertical restriction ring may cause contamination, since the inner vertical restriction ring is close to the wafer processing area. This embodiment provides improved WAP control.

The advantage of the embodiment with the outer vertical restriction ring is that it may provide the best WAP control. In addition, since the vertical restriction ring is further from the wafer area, the vertical restriction ring provides less contamination. However, this embodiment exposes a larger surface area to the plasma increasing the surface that needs to be cleaned. Both embodiments using a vertical restriction ring in addition to providing improved WAP control, also provide a much simpler control.

The advantage of providing three adjustable confinement rings is that the confinement window is extended. Such an embodiment can withstand a greater amount of part wear before there may be a significant change in control characteristics.

While this invention has been described in terms of several preferred embodiments, there are alterations, permutations, and substitute equivalents which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A method for controlling wafer area pressure within a plasma processing device, comprising:

providing an etchant gas source to a wafer area region;

generating a plasma from the etchant gas source in the wafer area region;

confining the plasma within a vertical restriction ring; and adjusting a confinement ring adjacent to a free end of the vertical restriction ring.

2. A plasma processing device, comprising:

a vacuum chamber;

an exhaust port in fluid connection with the vacuum chamber;

a gas source in fluid connection with the vacuum chamber; and a confinement device for providing wafer area pressure control greater than 40%.

3. The plasma processing device, as recited in claim 2, wherein the confinement device comprises:
   a first adjustable confinement ring within the vacuum chamber; and
   a second adjustable confinement ring within the vacuum chamber.

4. The plasma processing device, as recited in claim 3, further comprising a controller connected to the first adjustable confinement ring and the second adjustable confinement ring, wherein the controller is able to adjust the first adjustable confinement ring and the second adjustable confinement ring during plasma processing in the plasma processing device.

5. The plasma processing device, as recited in claim 4, further comprising a third confinement ring.

6. The plasma processing device, as recited in claim 5, wherein the third confinement ring is adjustable.

7. The plasma processing device, as recited in claim 6, wherein the controller is connected to the third confinement ring.

8. The plasma processing device, as recited in claim 2, wherein the confinement device comprises:
   a vertical restriction ring within the vacuum chamber; and
   a adjustable confinement ring within the vacuum chamber.

9. The plasma processing device, as recited in claim 8, wherein the vertical restriction ring has a first end connected to the plasma processing device and a second end, which is a free end and which is adjacent to the adjustable confinement ring.

10. The plasma processing device, as recited in claim 9, further comprising a controller connected to the adjustable confinement ring for adjusting the confinement ring during plasma processing in the plasma processing chamber.

11. The plasma processing device, as recited in claim 10, wherein the vertical restriction ring is on the outside of the confinement ring.

12. The plasma processing device, as recited in claim 11, wherein the free end of the vertical restriction ring has a lip.

13. The plasma processing device, as recited in claim 12, wherein the confinement ring has a lip.

14. The plasma processing device, as recited in claim 10, wherein the vertical restriction ring is on the inside of the confinement ring.

15. The plasma processing device, as recited in claim 14, wherein the free end of the vertical restriction ring has a lip.

16. The plasma processing device, as recited in claim 15, wherein the confinement ring has a lip.

17. The plasma processing device, as recited in claim 16, further comprising a chuck within the vacuum chamber for holding a substrate within the vacuum chamber.

18. A plasma processing device, comprising:
   a vacuum chamber;
   an exhaust port in fluid connection with the vacuum chamber;
   a gas source in fluid connection with the vacuum chamber; and
   a confinement device, wherein the confinement device comprises:
      a vertical restriction ring within the vacuum chamber; and
      a adjustable confinement ring within the vacuum chamber.

19. The plasma processing device, as recited in claim 18, wherein the vertical restriction ring has a first end connected to the plasma processing device and a second end, which is a free end and which is adjacent to the adjustable confinement ring.

20. The plasma processing device, as recited in claim 19, further comprising a controller connected to the adjustable confinement ring for adjusting the confinement ring during plasma processing in the plasma processing chamber.

21. The plasma processing device, as recited in claim 20, wherein the vertical restriction ring is on the outside of the confinement ring.

22. The plasma processing device, as recited in claim 21, wherein the free end of the vertical restriction ring has a lip.

23. The plasma processing device, as recited in claim 22, wherein the confinement ring has a lip.

24. The plasma processing device, as recited in claim 20, wherein the vertical restriction ring is on the inside of the confinement ring.

25. The plasma processing device, as recited in claim 24, wherein the free end of the vertical restriction ring has a lip.

26. The plasma processing device, as recited in claim 24, wherein the confinement ring has a lip.

27. The plasma processing device, as recited in claim 26, further comprising a chuck within the vacuum chamber for holding a substrate within the vacuum chamber.

* * * * *